United States Patent [19]
Saw et al.

[11] Patent Number: 5,835,990
[45] Date of Patent: Nov. 10, 1998

[54] LONGITUDINALLY COUPLED DOUBLE MODE SURFACE WAVE RESONATORS

[75] Inventors: John Choo Beng Saw; Ji-Dong Dai, both of Kanata; Yufeng Xu, Nepean; Mark Spencer Suthers, Lanark; Conrad François Gratton, Casselman, all of Canada

[73] Assignee: Northern Telecom Limited, Montreal, Canada

[21] Appl. No.: 659,455

[22] Filed: Jun. 6, 1996

Related U.S. Application Data

[60] Provisional application No. 60/000,283 Jun. 16, 1995.
[51] Int. Cl.⁶ .............................. H03H 9/72; H01L 41/08
[52] U.S. Cl. .................... 310/313 D; 310/313 B
[58] Field of Search ........................ 310/313 B, 313 D, 310/313 R

[56] References Cited

U.S. PATENT DOCUMENTS

| | | | |
|---|---|---|---|
| 3,868,608 | 2/1975 | Williams | 333/72 |
| 3,872,410 | 3/1975 | Zucker | 333/72 |
| 4,044,321 | 8/1977 | Vasile | 310/313 B |
| 4,468,642 | 8/1984 | Hikita | 310/313 D |
| 5,309,126 | 5/1994 | Allen | 310/313 B |
| 5,349,260 | 9/1994 | Anemogiannis et al. | 310/313 D |
| 5,365,138 | 11/1994 | Saw et al. | 310/313 |
| 5,392,013 | 2/1995 | Yamamoto et al. | 310/313 B |
| 5,434,466 | 7/1995 | Hickernell et al. | 310/313 D |
| 5,485,052 | 1/1996 | Seki et al. | 310/313 B |
| 5,568,002 | 10/1996 | Kawakatsu et al. | 310/313 B |
| 5,600,287 | 2/1997 | Kwan et al. | 310/313 B |
| 5,625,329 | 4/1997 | Koike | 310/313 D |

FOREIGN PATENT DOCUMENTS

| | | | |
|---|---|---|---|
| 0 569 977 A1 | 11/1993 | European Pat. Off. | 310/313 B |
| 0605884 | 7/1994 | European Pat. Off. | H03H 9/145 |
| 5-299967 | 11/1993 | Japan | 310/313 B |
| WO 91/09464 | 6/1991 | WIPO | 310/313 D |

OTHER PUBLICATIONS

"Wideband Low Loss Double Mode SAW Filters", T. Morita et al, Proceedings of the IEEE Ultrasonics Symposium, 1992, pp. 95–104.

*Primary Examiner*—Thomas M. Dougherty
*Attorney, Agent, or Firm*—R. John Haley

[57] ABSTRACT

A longitudinally coupled double mode surface wave resonator comprises two reflectors, two lateral IDTs (inter-digital transducers), and a centre IDT arranged on a surface of a piezoelectric substrate, for coupling surface waves longitudinally between the IDTs. The two lateral IDTs operate with opposite signal phases by virtue of opposite connections, opposite polarities, or oppositely phased spacings from the centre IDT. Alternatively, or in addition, the centre IDT is divided into two oppositely phased halves. A filter comprising one or more resonators can replace both a filter and a balun in a radio frequency circuit.

41 Claims, 10 Drawing Sheets

LONGITUDINALLY COUPLED DOUBLE MODE SURFACE WAVE RESONATORS

This application claims the benefit of United States Provisional Application No. 60/000,283 filed Jun. 16, 1995, the entire disclosure of which is hereby incorporated herein by reference.

This invention relates to double mode surface wave resonators, and is particularly concerned with longitudinally coupled resonators, also referred to as LCRs. The term "surface wave" is used herein to embrace surface acoustic waves (SAWs), including leaky SAWs, and surface skimming bulk waves.

BACKGROUND OF THE INVENTION

Saw et al. U.S. Pat. No. 5,365,138 issued Nov. 15, 1994 and entitled "Double Mode Surface Wave Resonators" describes a transversely coupled double mode surface wave resonator comprising two IDTs (inter-digital transducers), arranged side by side between reflection gratings, on a surface of a piezoelectric substrate to provide for coupling of surface waves therebetween, each IDT having interleaved electrodes extending from a common rail between the two IDTs and from a respective outer rail of the IDT. One or each of the IDTs and its outer rail is divided into two halves for providing a differential signal connection to the resonator. Such a resonator is particularly useful for filtering at an IF (intermediate frequency) in cellular radio (including personal communications systems, or PCS) equipment, without requiring the use of a balun (balanced-to-unbalanced signal transformer) to convert between a single ended or unbalanced signal and a differential or balanced signal which is preferred at the IF for linearity and bandwidth.

A paper by T. Morita et al. entitled "Wideband Low Loss Double Mode SAW Filters", Proceedings of the IEEE Ultrasonics Symposium, 1992, pages 95 to 104, discusses the use of longitudinally coupled double mode surface wave resonators (LCRs) for RF (radio frequency) filtering in cellular radio equipment and explains why a greater bandwidth is generally required for filtering at RF than can be provided by transversely coupled double mode surface wave resonators. The LCR comprises a symmetrical arrangement of a centre IDT between two lateral IDTs and two reflection gratings, with a first unbalanced connection to the centre IDT and a second unbalanced connection to the two lateral IDTs which are connected in parallel with one another. In a preferred (for greatest bandwidth and coupling) form of the LCR described in the paper, there is no space between adjacent fingers of the centre and lateral (input and output) IDTs, and it is necessary that these adjacent touching fingers be grounded to achieve a practical pattern configuration.

The front end (i.e. RF circuitry) of a transmitter-receiver unit in cellular radio equipment typically comprises a SAW image reject filter arranged between a double balanced mixer and a single ended amplifier (the input of a power amplifier in the transmitter, or the output of a low noise amplifier in the receiver). The double balanced mixer is typically formed on a GaAs (gallium-arsenide) integrated circuit on which a balun is also needed to couple the balanced termination of the mixer and the unbalanced termination of the SAW filter. This has the disadvantages that the balun occupies about half of the area of the GaAs integrated circuit chip, reduces production yield, and can not be tested at d.c. like the mixer. This chip therefore has significant costs. In order to reduce these costs, it would be desirable to avoid the need for the balun.

It is conceivable that the amplifier referred to above may desirably also have a balanced input or output which is to be coupled to the SAW filter. However, this would impose a requirement for another balun for coupling the balanced termination of the amplifier to the unbalanced termination of the SAW filter. Obviously, the need for another balun is preferably avoided for the same reasons as given above.

It is known, from Williams U.S. Pat. No. 3,868,608 issued Feb. 25, 1975 and entitled "Surface Wave Filter", to provide a SAW filter in which two output IDTs are positioned one on each side of an input IDT to receive the surface waves launched in opposite directions by the input IDT, with the output IDTs arranged to provide a differential output to the balanced input of an amplifier, in order to compensate for parasitic effects such as bulk wave coupling and inductive and capacitive coupling between the input and output IDTs.

It is also known, from Zucker U.S. Pat. No. 3,872,410 issued Mar. 18, 1975 and entitled "Surface Wave Filter For TV IF Stage", to provide a SAW filter in which a similar arrangement of one input and two output IDTs, providing a differential output to the balanced input of an amplifier, includes common ground electrodes between the input and output IDTs in order to reduce direct feed-through between the IDTs with close input-output IDT spacings.

The SAW filters of these patents only have input and output IDTs, with no reflection gratings, and the patents do not relate to double mode longitudinally coupled resonators. The differential connections of the output IDTs, and the balanced input of the amplifier, are provided only to enable the parasitic effects referred to above to be compensated.

An object of this invention is to provide an improved longitudinally coupled double mode surface wave resonator, the use of which enables the disadvantages discussed above to be reduced or avoided.

SUMMARY OF THE INVENTION

According to one aspect of this invention there is provided a longitudinally coupled double mode surface wave resonator comprising: a piezoelectric substrate; two reflectors, two lateral IDTs (inter-digital transducers), and a centre IDT arranged on a surface of the substrate, with the IDTs between the two reflectors and with the centre IDT between the two lateral IDTs so that surface waves are coupled between the IDTs, each IDT having interleaved fingers extending from rails for providing connections to the IDT; and a differential signal connection to the two lateral IDTs, the differential signal connection comprising a respective connection to one rail of each lateral IDT, the arrangement being such that the two lateral IDTs operate with opposite signal phases.

The two lateral IDTs can be arranged to operate with opposite signal phases by signal connections to rails on opposite sides of the two lateral IDTs, or by opposite polarities of fingers of the two lateral IDTs, or by different spacings of the lateral IDTs from the centre IDT. The centre IDT and at least one of its rails can also, or alternatively, be divided into two halves arranged to operate with opposite signal phases, for example by opposite polarities of fingers of the two halves of the centre IDT.

According to another aspect this invention provides a longitudinally coupled double mode surface wave resonator comprising: a piezoelectic substrate; and two reflectors, two lateral IDTs (inter-digital transducers), and a centre IDT arranged on a surface of the substrate, with the IDTs between the two reflectors and with the centre IDT between the two lateral IDTs so that surface waves are coupled between the IDTs, each IDT having interleaved fingers extending from rails for providing connections to the IDT; wherein the centre IDT and at least one of its rails is divided into two halves arranged to operate with opposite signal phases with a balanced signal connection thereto.

A finger-to-finger spacing of the centre IDT from each of the two lateral IDTs is preferably about $\lambda/4+n\lambda/2$, where X is the wavelength of a SAW to be propagated and n is zero or a positive integer. When n is zero, and if as is usual the fingers of the IDTs have a width of $\lambda/4$, then adjacent fingers of the centre IDT and each lateral IDT touch along their lengths; in this case desirably a gap is provided at a point along the length or at an end of the touching fingers to avoid a short circuit.

Thus the invention provides different embodiments in which opposite phases are provided by the two lateral IDTs, to enable a differential or balanced signal connection thereto, either through opposite connections to these IDTs, or through opposite polarities of these IDTs, or through oppositely phased spacings of these IDTs from the centre IDT. Alternatively, or in addition, the centre IDT is divided into two oppositely phased halves to provide a differential or balanced signal connection thereto. In any event, the differential or balanced signal connection enables the resonator to be connected directly to a balanced connection of a mixer (or any other circuit), without a balun.

A plurality of resonators, at least one of which is as recited above, can be connected in cascade to provide a higher order filter.

The invention also provides a radio frequency circuit including a mixer and a surface wave resonator as recited above, wherein the mixer has a balanced termination connected directly to said differential or balanced signal connection.

BRIEF DESCRIPTION OF THE DRAWINGS

The invention will be further understood from the following description with reference to the accompanying drawings, in which.

DETAILED DESCRIPTION

Figure 1:
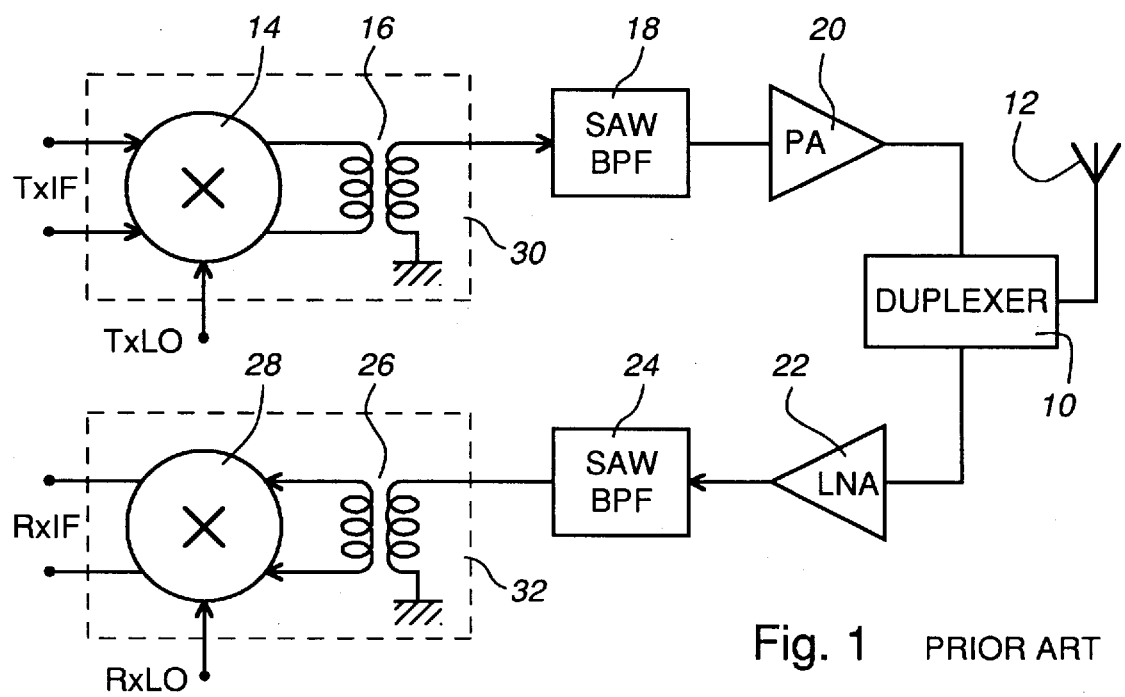
FIG. 1 schematically illustrates a known front end circuit of a transmitter-receiver unit for cellular radio (e.g. PCS) equipment.

Referring to FIG. 1, a known front end circuit of a transmitter-receiver unit for cellular radio (e.g. PCS) equipment comprises transmitter and receiver circuits coupled via a duplexer 10 to an antenna 12. The transmitter circuit comprises a double balanced mixer 14 which is supplied with a balanced IF transmit signal TxIF and a transmitter local oscillator signal TxLO to produce a balanced RF transmit signal which is coupled via a balun 16 to a SAW image reject band pass filter (BPF) 18, the filtered signal being supplied via a power amplifier (PA) 20 and the duplexer 10 to the antenna 12. Conversely, a signal received via the antenna 12 and the duplexer 10 is supplied to the receiver circuit which comprises a low noise amplifier (LNA) 22 whose output is coupled via an image reject SAW band pass filter 24 and a balun 26 to a double balanced mixer 28 which is also supplied with a receiver local oscillator signal RxLO to produce a balanced IF receive signal RXIF.

The mixer 14 and balun 16 are provided on a GaAs integrated circuit chip as represented by a broken line box 30. Similarly, the balun 26 and mixer 28 are provided on a GaAs integrated circuit chip as represented by a broken line box 32. As explained in the introduction, the need to provide a balun on each GaAs integrated circuit chip increases costs for reasons of space, yield, and testing.

Each of the SAW image reject filters 18 and 24 is constituted by at least one longitudinally coupled dual mode surface wave resonator (LCR) as described below and in the paper by Morita et al. referred to above.

Figure 2:
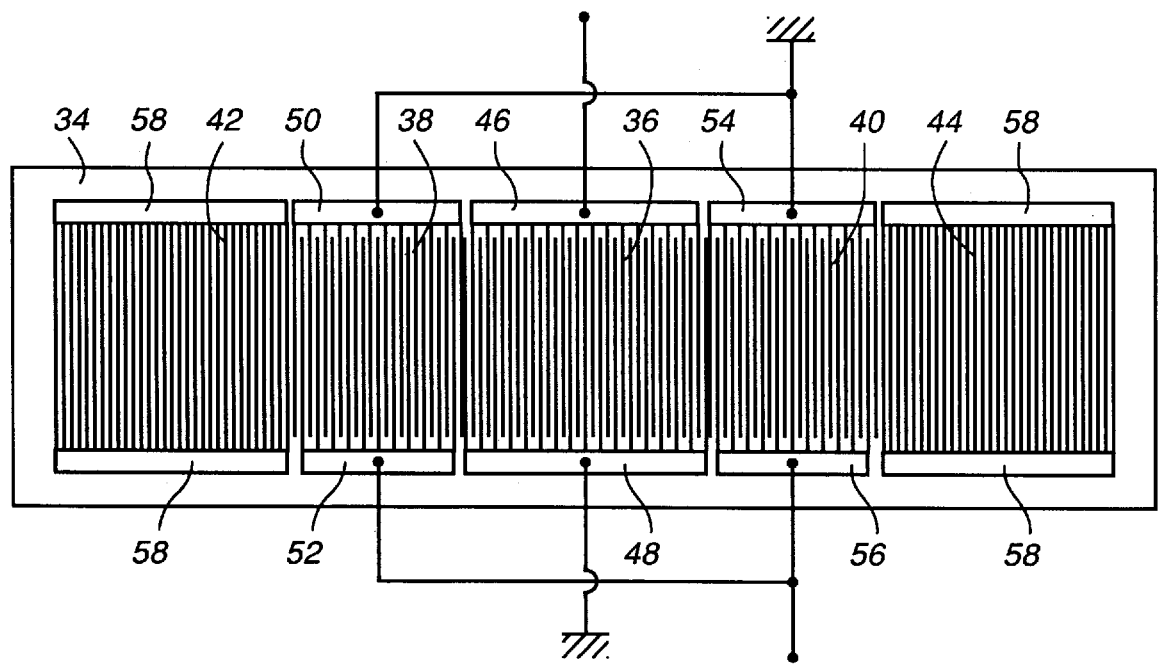
FIG. 2 schematically illustrates a known longitudinally coupled double mode SAW resonator (LCR) for use in the unit of FIG. 1.

Referring to FIG. 2, the LCR comprises a substrate 34 of piezoelectric material on which a centre IDT 36 and two lateral IDTs 38 and 40 are arranged symmetrically and positioned longitudinally between two reflection gratings 42 and 44.

The centre IDT 36 comprises inter-digital electrodes or fingers which have a width of $\lambda/4$ and a pitch of $\lambda/2$, where $\lambda$ is the wavelength of a SAW to be propagated, with electrodes or fingers extending from opposite rails 46 and 48 of the IDT overlapping one another over most of their length, referred to as the acoustic aperture of the IDT. Similarly, each of the lateral IDTs 38 and 40 comprises inter-digital fingers, with the same width of $\lambda/4$, pitch of $\lambda/2$, and overlapping length as the fingers of the centre IDT 36, extending from opposite rails 50, 52 of the IDT 38 and 54, 56 of the IDT 40.

The reflection gratings 42 and 44 also comprise fingers with the same width $\lambda/4$ and pitch $\lambda/2$; this pitch can be increased or decreased to reduce the level of spurious modes in the resonator. As shown in FIG. 2, the fingers of the reflection gratings 42 and 44 extend between and are interconnected by outer rails 58 which are electrically floating. Alternatively, these rails can be grounded, or these rails can be omitted, the fingers of the reflection gratings then all individually being electrically floating. Furthermore, the reflection gratings 42 and 44 can be constituted by reflector grooves in the substrate 34, as is known in the art. Similar comments apply to the embodiments of the invention as described below.

The pitch of $\lambda/2$ is maintained as a finger-to-finger distance or separation of the lateral IDT 38 from the reflection grating 42, and of the lateral IDT 40 from the reflection grating 44. In order to achieve a maximum bandwidth and optimum coupling as described in the paper by Morita et al., the finger-to-finger distance or separation of the centre IDT 36 from each of the lateral IDTs 38 and 40 is reduced to $\lambda/4$. As the width of each finger is also $\lambda/4$, this results in the adjacent fingers of the centre IDT 36 and the lateral IDTs 38 and 40 touching, as is shown in FIG. 2.

Figure 3:
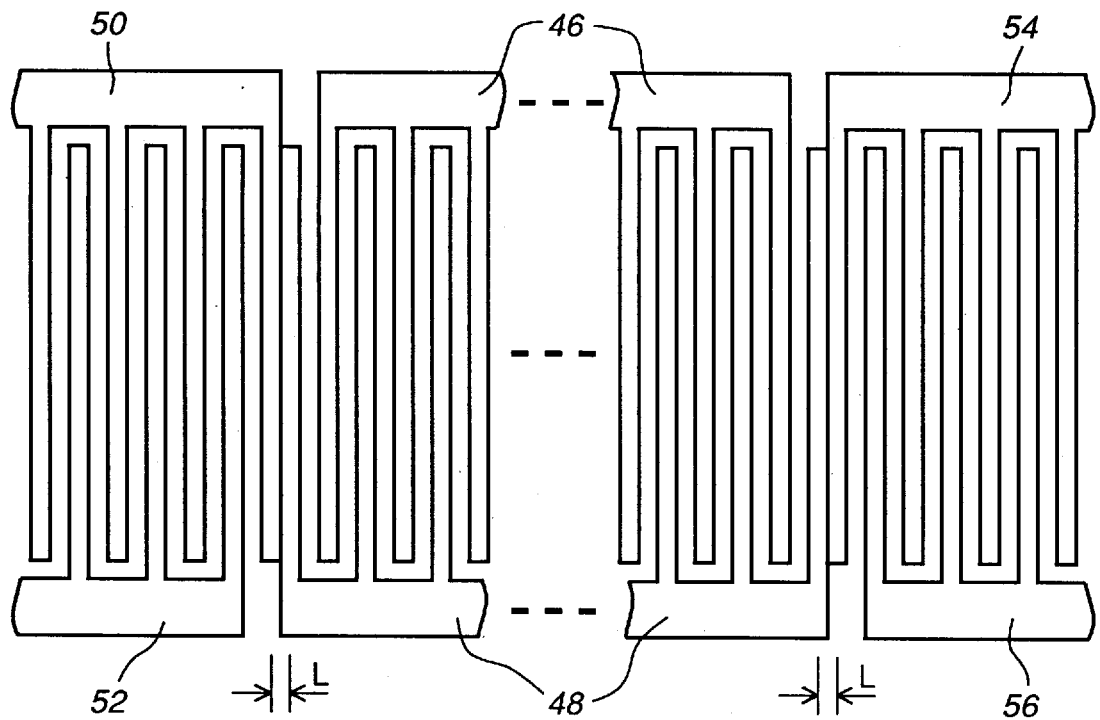
FIG. 3 schematically illustrates in greater detail features of the LCR of FIG. 2.

FIG. 3 illustrates in greater detail the regions at the boundaries between the centre IDT 36 and the lateral IDTs 38 and 40, showing the touching fingers with the separation of the IDTs denoted by L, which as illustrated is equal to the finger width $\lambda/4$.

Referring again to FIG. 2, the lateral IDTs 38 and 40 are connected in parallel with one another, with the rails 50 and 54 connected to ground and the rails 52 and 56 being connected to an output (or input) terminal of the resonator. The rail 46 of the centre IDT 36 is connected to an input (or output) terminal of the resonator, and the rail 48 is connected to ground. The grounding of the rails 48, 50, and 54 ensures that the adjacent, touching, fingers of the centre and lateral IDTs are all grounded, so that the touching fingers do not provide a short circuit of the resonator. The resonator consequently also necessarily has single ended, or unbalanced, input and output connections.

By way of example, the substrate 34 can comprise 64° Y-X lithium niobate, with $\lambda$ corresponding to a centre frequency of 836.5 MHz. The conductive electrodes and fingers can be of aluminium having a thickness of 2000 Å, with an acoustic aperture of 40 $\lambda$. The centre IDT 36 can have about 31 electrodes, each of the lateral IDTs 38 and 40 can have about 19 electrodes, and each of the reflection gratings 42 and 44 can have about 250 fingers. These parameters are given purely by way of example, and these or different parameters apply equally to all of the embodiments of the invention described below. With such numbers of electrodes and fingers, it should be appreciated that the illustrations of the electrodes and fingers in the drawings are purely diagrammatic to facilitate a full description of the various arrangements.

As is described in the paper by Morita et al., with the LCR arranged and connected in this manner the second longitudinal mode is not excited, and the resonator or filter is configured using only the first and third longitudinal modes. The resonance frequencies of the first and third longitudinal modes, which determine the bandwidth of the filter, have the greatest difference, and hence produce the greatest bandwidth for the filter, when the separation L, between the adjacent grounded fingers of the centre IDT 36 and each of the lateral IDTs 38 and 40 as described above, is equal to $\lambda/4$. More generally, the bandwidth is greatest when $L=\lambda/4+n\lambda/2$, where n is zero or a positive integer, but the acoustic coupling between the IDTs is reduced when n is greater than zero.

Figure 4:
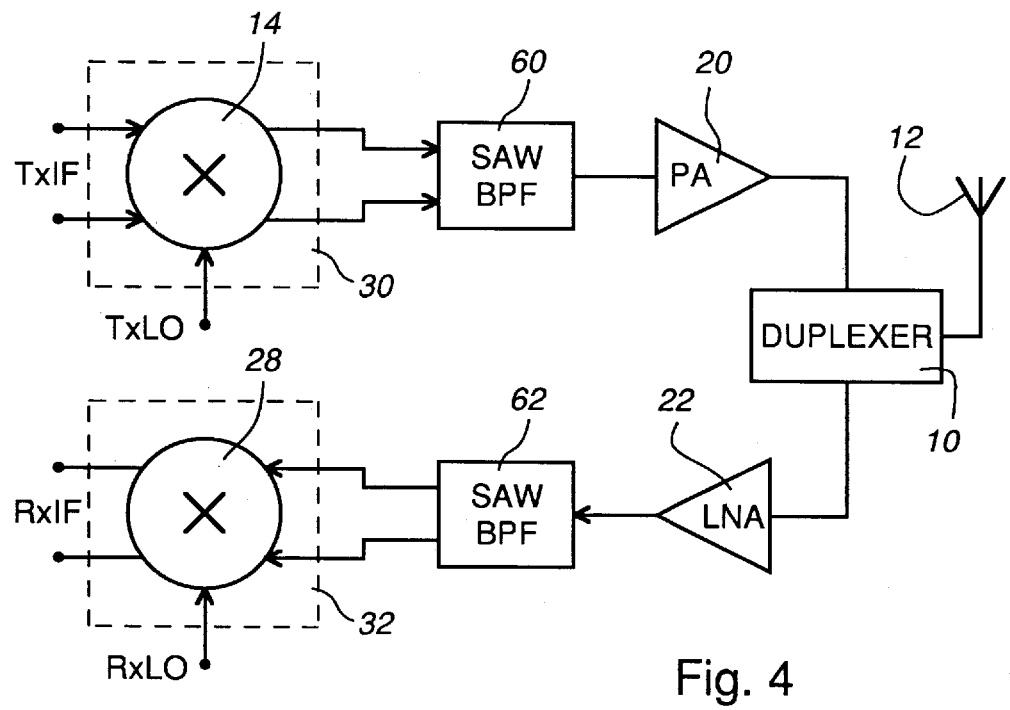
FIG. 4 schematically illustrates a front end circuit of a transmitter-receiver unit for cellular radio (e.g. PCS) equipment which uses LCRs in accordance with this invention.

FIG. 4 illustrates a front end circuit of a transmitter-receiver unit in which a SAW image reject band pass filter (BPF) 60 replaces both the SAW BPF 18 and the balun 16 in the transmitter circuit of the unit of FIG. 1, and a SAW image reject BPF 62 replaces both the SAW BPF 24 and the balun 26 in the receiver circuit of the unit of FIG. 1. The SAW filters 60 and 62 each have any of the forms in accordance with the invention as described below to provide balanced or differential connections to the double balanced mixers 14 and 28 respectively. Consequently the baluns 16 and 26 in the unit of FIG. 1 are not required in the unit of FIG. 4. As a result, the area of the GaAs chips 30 and 32 is approximately halved, production yields accordingly increased, testing simplified because the mixers can be tested at d.c., and costs decreased. The other parts of the unit of FIG. 4 are the same as described above with reference to FIG. 1.

FIGS. 5 and 6, 7 and 8, 9 and 10, 11 and 12, and 13 and 14 illustrate longitudinally coupled dual mode surface wave resonators, or LCRs, in accordance with first to fifth, respectively, embodiments of the invention. Each LCR can be used to constitute all or part of (depending on the number of poles required as described later below) each of the SAW BPFs 60 and 62 in the transmitter-receiver unit of FIG. 4. For each embodiment, the odd-numbered figure illustrates the LCR and its connections in a manner similar to the illustration of the prior art in FIG. 2, and the even-numbered figure illustrates the boundary regions between the centre IDT 36 and the lateral IDTs 38 and 40 in a manner similar to the illustration of the prior art in FIG. 3. In contrast to the prior art arrangement as shown in FIG. 2, in each of these embodiments of the invention the two lateral IDTs 38 and 40 are not connected in parallel with one another but instead provide a differential or balanced connection for the LCR.

Figure 5:
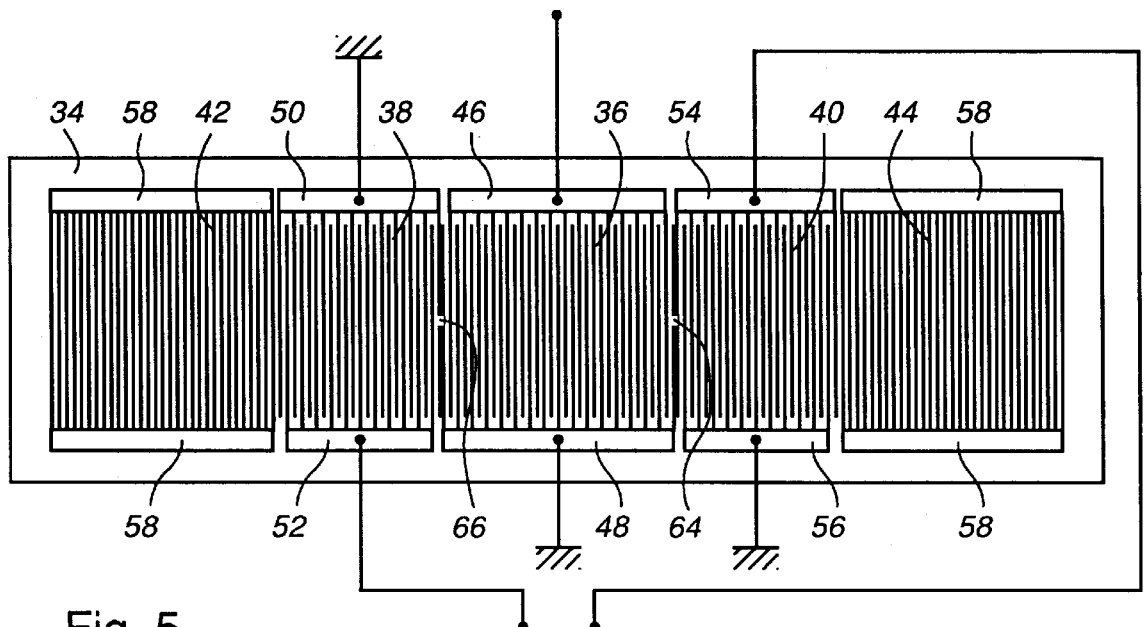
FIG. 5 schematically illustrates, and FIG. 6 schematically illustrates in greater detail features of, an LCR in accordance with a first embodiment of this invention.
Figure 6:
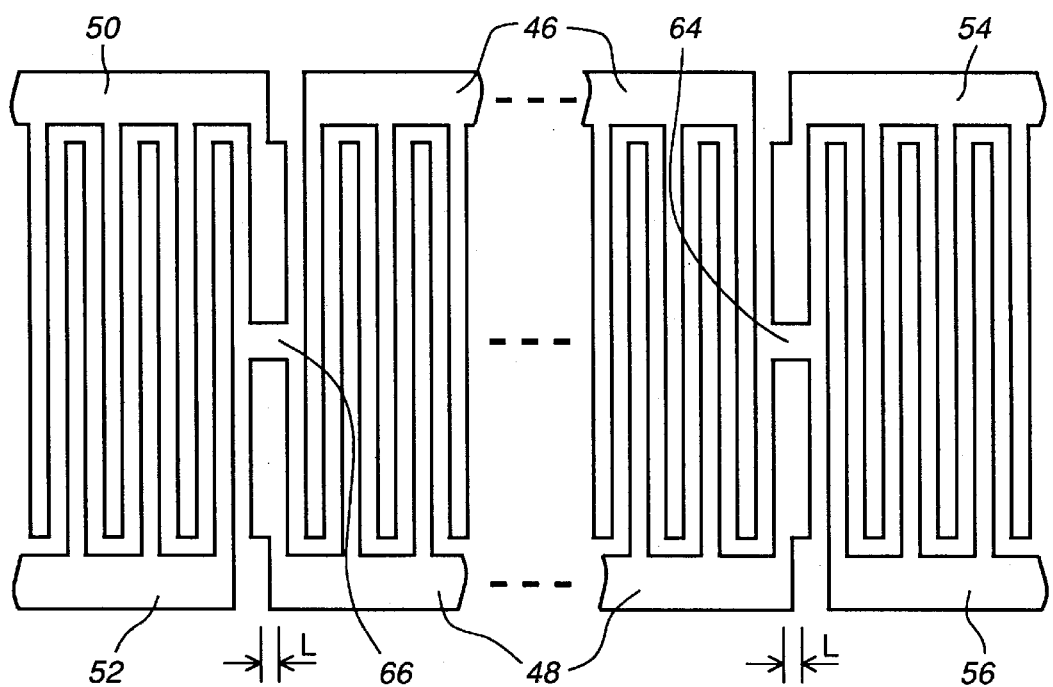

Referring to FIGS. 5 and 6, in the first embodiment of the invention the centre IDT 36 provides a single ended or unbalanced connection with the rail 46 connected to a signal terminal (e.g. an input terminal) and the rail 48 grounded, as in the prior art. Connections to the two lateral IDTs 38 and 40 are arranged to provide a differential or balanced connection. As shown in FIG. 5, the rail 50 of the lateral IDT 38 and the rail 56 of the lateral IDT 40, on opposite sides of the LCR, are grounded, and the other rails 52 of the lateral IDT 38 and 54 of the lateral IDT 40, also on opposite sides of the LCR, are connected to respective differential signal terminals (e.g. output terminals).

As in the known LCR of FIGS. 2 and 3, in the LCR of FIGS. 5 and 6 the spacing L between the centre IDT 36 and each of the lateral IDTs 38 and 40 is $\lambda/4$, so that the adjacent fingers of these IDTs touch one another along their lengths. To avoid a short circuit of the rail 54 to ground via the rail 48, these touching fingers are interrupted at a point along their length by a gap 64. This gap 64 is shown in the drawings as being midway along the lengths of the touching fingers at the boundary between the IDTs 36 and 40, but it can instead be anywhere along the length or at either end of the touching fingers.

A similar interruption or gap 66 is provided at a point mid-way along the lengths of the touching fingers at the boundary between the IDTs 36 and 38. Although this gap 66 is not required to avoid a short circuit with the connections shown in FIG. 5, because both of the rails 48 and 50 to which the touching fingers at this boundary are connected are grounded, it is desirable to maintain symmetry of the LCR. In addition, it provides the important advantage that other connections to the LCR are possible without risk of a short circuit. For example, the connections to the rails 46 and 48 of the centre IDT 36 can 35 be reversed. In this respect it should be appreciated that the particular connections shown throughout the drawings are given by way of example, and that input and output connections, and connections to the centre IDT 36 and to the lateral IDTs 38 and 40, can be interchanged.

Figure 7:
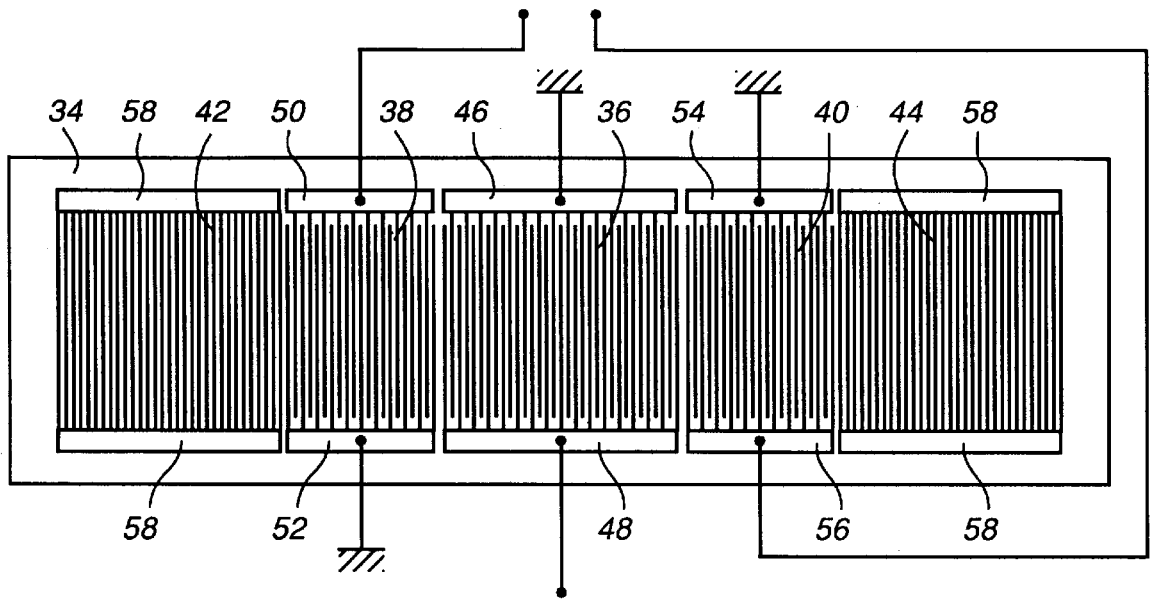
FIG. 7 schematically illustrates, and FIG. 8 schematically illustrates in greater detail features of, an LCR in accordance with a second embodiment of this invention.
Figure 8:
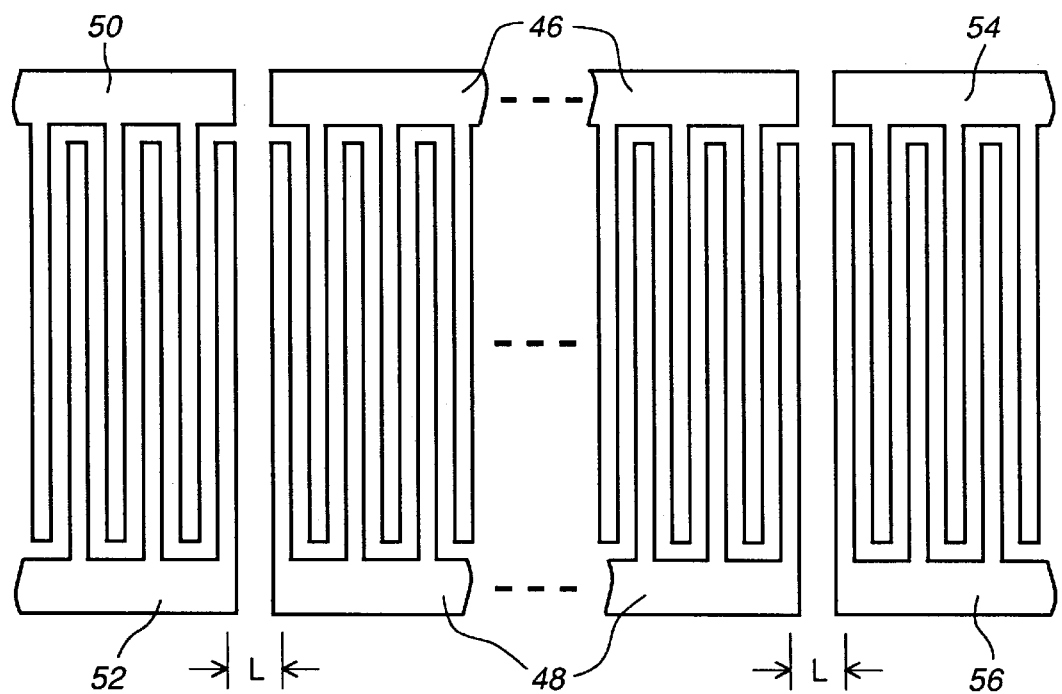

This is illustrated by the second embodiment of the invention illustrated in FIGS. 7 and 8. As shown in FIG. 7, in this case the rail 46 of the centre DT 36 is grounded, the rail 48 providing an unbalanced (e.g. output) signal connection to the LCR, the opposite rails 52 and 54 of the lateral IDTs 38 and 40 respectively are grounded, and the opposite rails 50 and 56 of the lateral IDTs 38 and 40 respectively provide a balanced (e.g. input) signal connection to the LCR.

In this second embodiment, as best shown in FIG. 8, the spacing L between the centre IDT 36 and each of the lateral IDTs 38 and 40 is increased to $3\lambda/4$, so that the adjacent fingers of these IDTs no longer touch one another along their lengths. Consequently, there is no need in this case for the gaps 64 and 66. It is noted here that the increase in the spacing L by $\lambda/2$ changes the signal phase for each lateral IDT by 180°; this applies to both of the lateral IDTs 38 and 40 so that their relative phase is unchanged and they still provide a differential or balanced-output with the connections shown.

Considered generally, the first and second embodiments of the invention have a spacing L between the centre IDT 36 and each of the lateral IDTs 38 and 40 which is equal to $\lambda/4+n\lambda/2$, where n is zero or a positive integer. When n is zero, the adjacent fingers of the IDTs touch and short circuits are avoided by providing the gaps 64 and 66. When n is a positive integer greater than zero, for example when n=1 as in FIGS. 7 and 8, the adjacent fingers of the IDTs do not touch and these gaps 64 and 66 are not required. However, the coupling between the centre and lateral IDTs is reduced as n is increased from zero. For symmetry, it is preferred that the spacing L is the same between the centre IDT 36 and each of the lateral IDTs 38 and 40, but spacings which differ by integer multiples of $\lambda$ can be used.

In each of the first and second embodiments of the invention as described above with reference to FIGS. 5 to 8, the differential or balanced connections to the lateral IDTs 38 and 40 are taken from opposite sides of the LCR. This may result in a relatively long connection path which may be undesirable. In each of the third and fourth embodiments of the invention as described below with reference to FIGS. 9 to 12 this is avoided, while achieving the same result, by changing the phase of one of the lateral IDTs 38 and 40. Again in these embodiments the spacing L between the centre IDT 36 and each of the lateral IDTs 38 and 40 is equal to $\lambda/4+n\lambda/2$ to achieve the greatest bandwidth. In the third embodiment of the invention, illustrated in FIGS. 9 and 10, n is zero, and in the fourth embodiment of the invention, illustrated in FIGS. 11 and 12, n=1.

Figure 9:
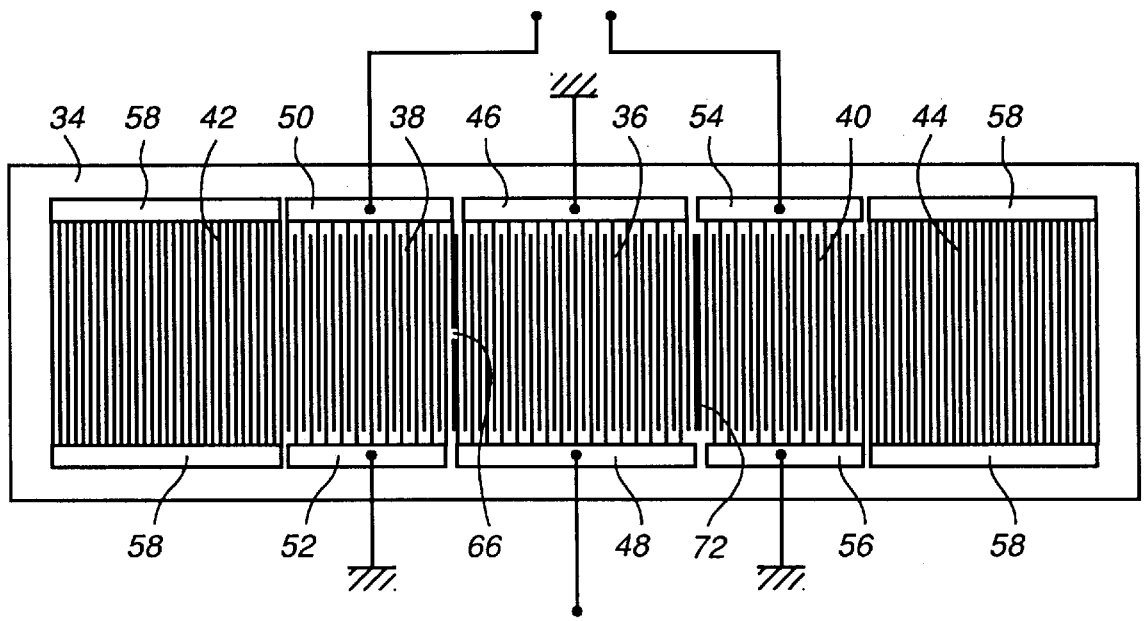
FIG. 9 schematically illustrates, and FIG. 10 schematically illustrates in greater detail features of, an LCR in accordance with a third embodiment of this invention.
Figure 10:
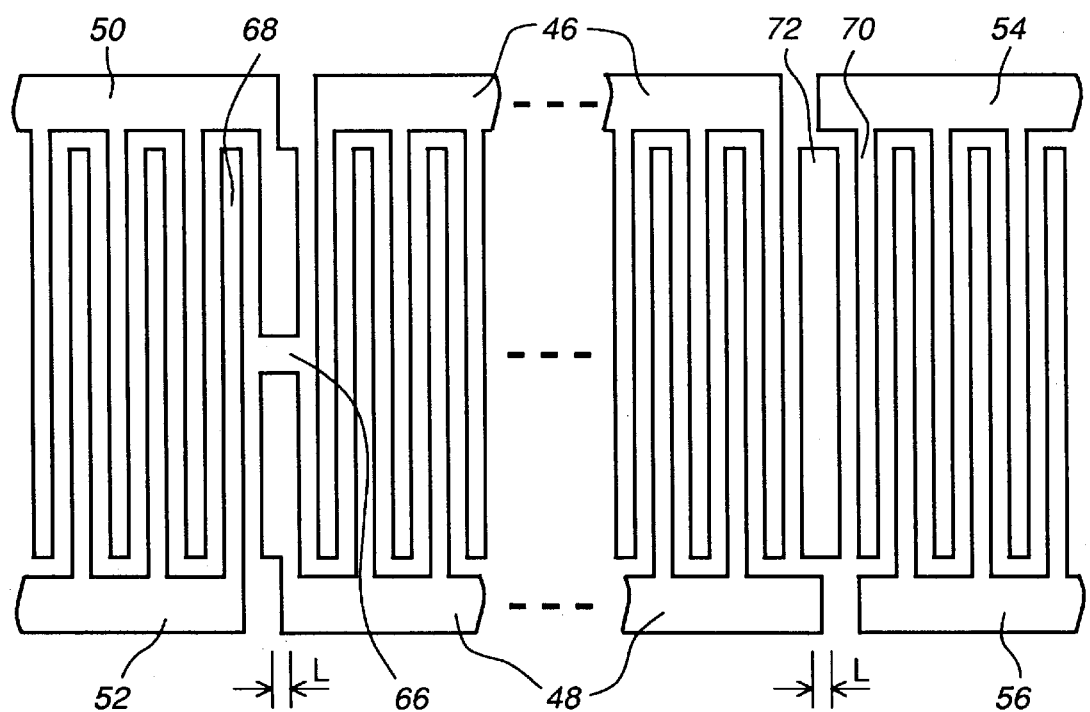

Referring to FIGS. 9 and 10, in the third embodiment of the invention the polarity of the lateral IDT 40 is reversed, i.e. the phase of this IDT is changed by 180°, relative to the lateral IDT 38. This is shown best in FIG. 10, in which it can be seen for example that whereas for the lateral IDT 38 the second finger 68 from the centre IDT 36 extends upwardly (as shown) from the rail 52, for the lateral IDT 40 the second finger 70 from the centre IDT 36 extends downwardly (as shown) from the rail 54 on the opposite side of the LCR. FIG. 9 illustrates connections to the LCR, the rails 52 and 56 of the lateral IDTs 38 and 40 on the same side of the LCR being grounded, the rails 50 and 54 of the lateral IDTs providing a differential or balanced (e.g. input) signal connection, the rail 46 of the centre IDT 36 being grounded, and the rail 48 of the centre IDT 36 providing a single ended or unbalanced (e.g. output) signal connection.

In this case with the spacing L=$\lambda/4$ (n is zero) and the rails 48 and 50 carrying different signals, the gap 66 is required in the adjacent, touching fingers at the boundary between the IDTs 36 and 38, as already explained above with reference to FIGS. 5 and 6. At the boundary between the IDTs 36 and 40, a short circuit via the adjacent, touching fingers between the rails 48 and 56 must also be avoided. It should be noted that it is the rail 56, on the same side of the LCR as the rail 48, which is referred to here because of the polarity reversal of the lateral IDT 40. As illustrated in FIGS. 9 and 10, a short circuit is conveniently avoided by providing the adjacent, touching fingers as a floating finger 72, having a width of $\lambda/2$, which is not connected to either of the rails 48 and 56. In other words, in this case a gap is provided at both ends of the adjacent, touching fingers constituted by the double-width finger 72.

The slight degree of asymmetry which the above arrangement produces is not significant. Even this can be reduced or avoided by connecting the lower (as shown) end of the finger 72 to the rail 48, and optionally either providing a gap in the finger 72 mid-way along its length so that only the upper (as shown) part of this finger is electrically floating, or providing no gap in the finger 72 and instead moving the gap 66 to be adjacent to the rail 50 so that the arrangement is symmetrical. The floating finger 72 can also be omitted entirely, but this is less desirable.

Figure 11:
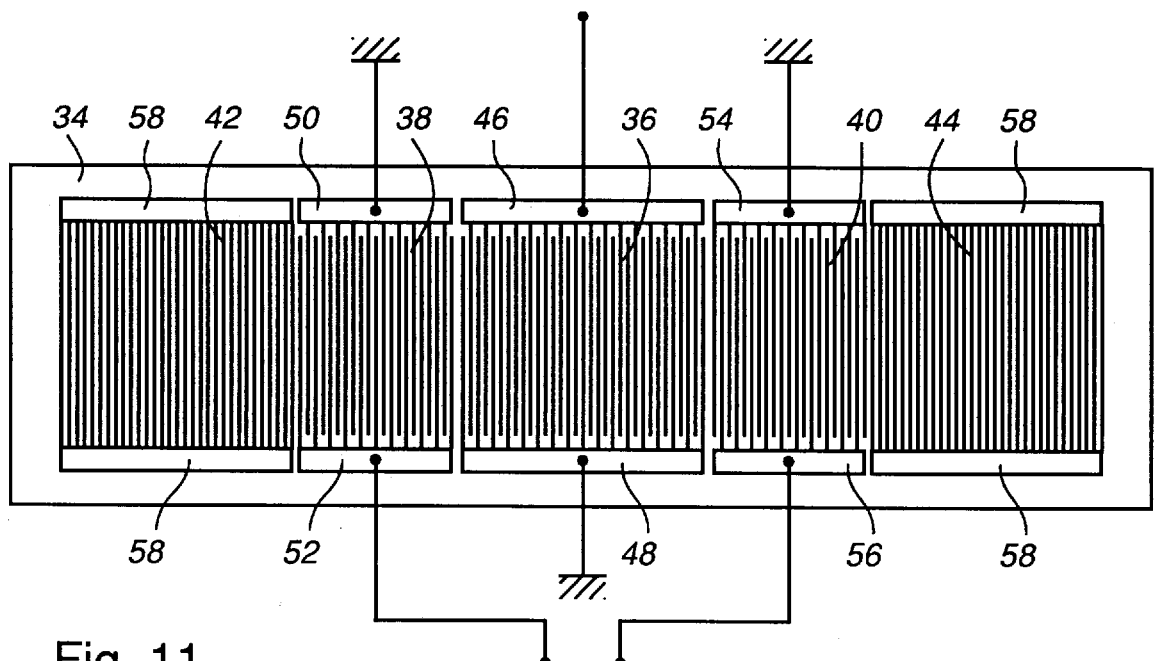
FIG. 11 schematically illustrates, and FIG. 12 schematically illustrates in greater detail features of, an LCR in accordance with a fourth embodiment of this invention.
Figure 12:
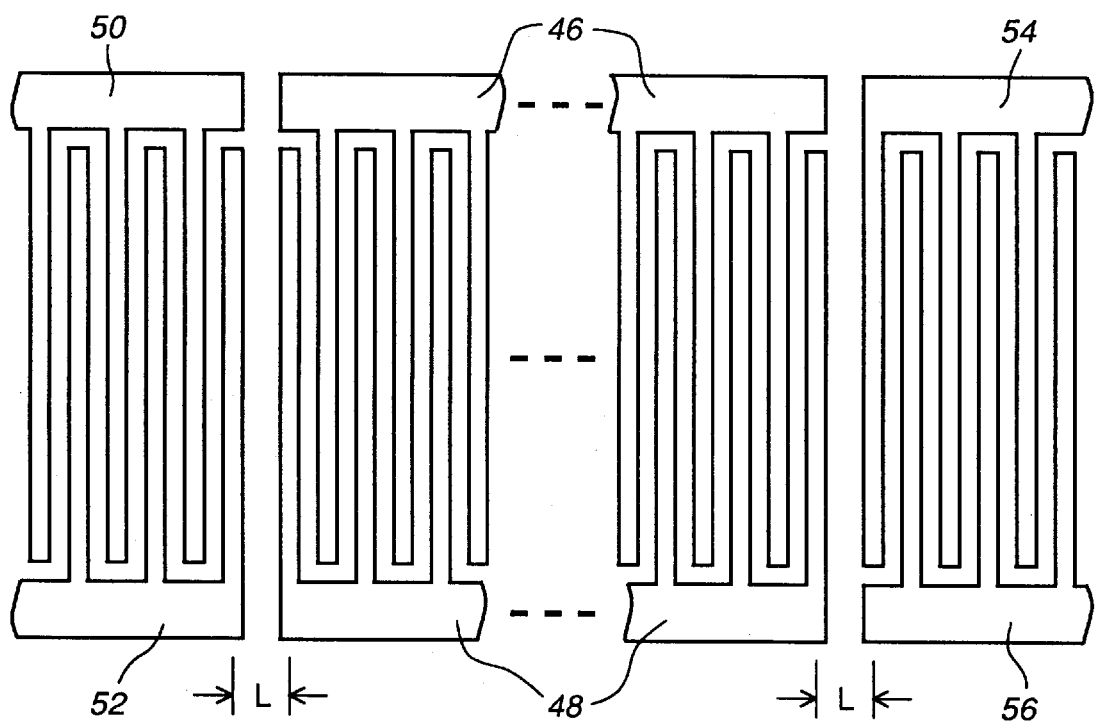

Referring to FIGS. 11 and 12, in the fourth embodiment of the invention the polarity of the lateral IDT 40 is also reversed, i.e. the phase of this IDT is changed by 180°, relative to the lateral IDT 38. This is shown best in FIG. 12, in which it can be seen for example that whereas for the lateral IDT 38 the finger adjacent to the centre IDT 36 extends upwardly (as shown) from the rail 52, for the lateral IDT 40 the finger adjacent to the centre IDT 36 extends downwardly (as shown) from the rail 54 on the opposite side of the LCR. In this case the spacing L=$3\lambda/4$ (i.e. n=1), so that there is no risk of a short circuit due to touching fingers and no gaps or electrically floating fingers are required.

FIG. 11 illustrates possible connections to the LCR, the rails 50 and 54 of the lateral IDTs 38 and 40 on the same side of the LCR being grounded, the rails 52 and 56 of the lateral IDTs providing a differential or balanced (e.g. output) signal connection, the rail 48 of the centre IDT 36 being grounded, and the rail 46 of the centre IDT 36 providing a single ended or unbalanced (e.g. input) signal connection.

In the fifth embodiment of the invention there is no interchange of connections as in the first and second embodiments or polarity reversal of IDTs as in the third and fourth embodiments; instead, one of the lateral IDTs is displaced by $\lambda/2$ (more generally, by $\lambda/2+m\lambda$, where m is zero or a positive integer) to provide an equivalent change of phase between the two lateral IDTs. Thus in the fifth embodiment of the invention the spacings of the lateral IDTs 38 and 40 from the centre IDT 36 are different; these spacings are referred to as L1 and L2 respectively, and FIGS. 13 and 14 illustrate the case in which L1=$\lambda/4$ (i.e. n=0) and L2=$3\lambda/4$ (i.e. n=1, m=0).

Figure 13:
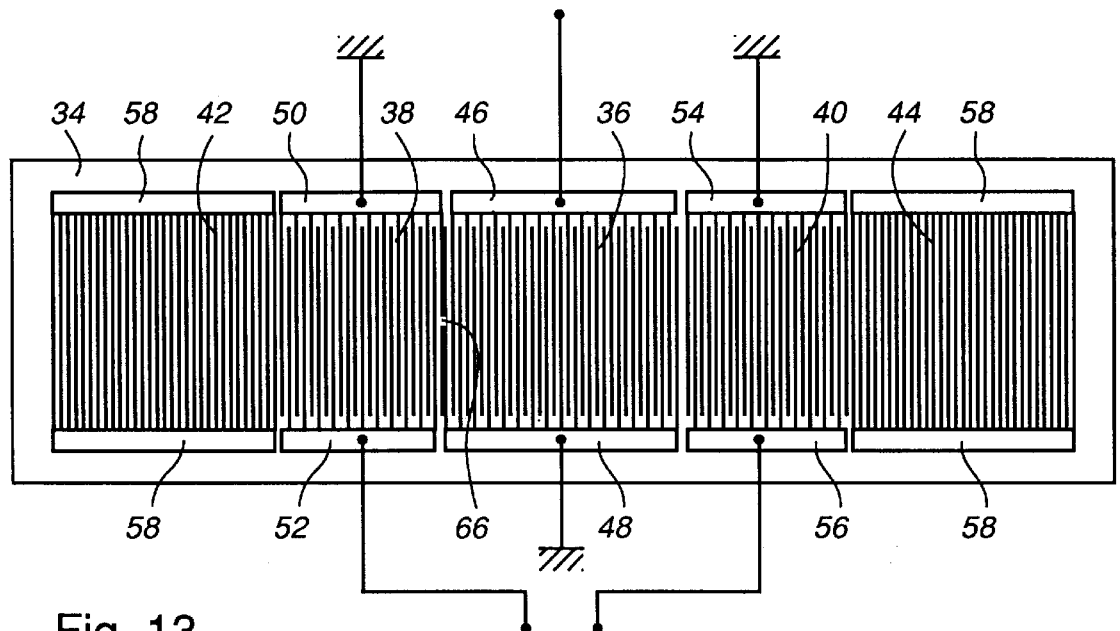
FIG. 13 schematically illustrates, and FIG. 14 schematically illustrates in greater detail features of, an LCR in accordance with a fifth embodiment of this invention.
Figure 14:
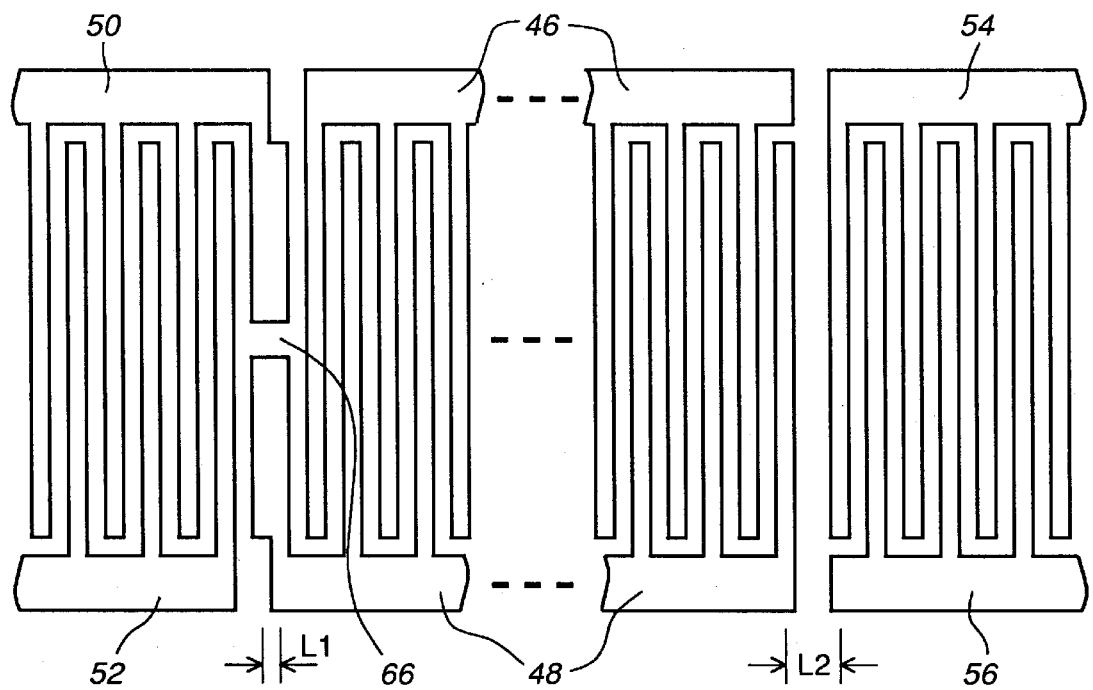

Referring to FIGS. 13 and 14, the centre IDT 36 has a single ended or unbalanced (e.g. input) connection to its rail 46 with its rail 48 grounded, and the lateral IDTs 38 and 40 have their rails 50 and 54 grounded and provide a differential or balanced (e.g. output) connection via their rails 52 and 56 on the same side of the LCR. A short circuit between the rails 48 and 50 due to the spacing L1 of the IDTs 36 and 38 is avoided in the same manner as described above by providing the gap 66 mid-way along the lengths of the adjacent, touching fingers. This gap is not essential with the connections as shown in FIG. 13, because the rails 48 and 50 are both grounded, but it can be essential with other possible connection arrangements, for example with a reversal of all of the signal and ground connections in FIG. 13. The greater spacing L2 of the IDTs 36 and 40 avoids a risk of any short circuit, and provides a phase difference of 180° between the two lateral IDTs 38 and 40 to provide the desired differential signal.

From the above description, it should be appreciated that a differential connection to the lateral IDTs 38 and 40 can be provided by oppositely phased connections to these IDTs as in FIGS. 5 to 9, or by opposite polarities of (i.e. 180° phase difference between) these IDTs, or by spacings of these IDTs from the centre IDT which differ from one another with a 180° phase difference. However the differential connection is achieved, it enables the LCRs to provide balanced connections directly to the double balanced mixers in the transmitter and receiver circuits, without using baluns. It should also be appreciated that the LCR combines the functions of a resonator and a balun, and may be used in other applications where such functions are useful.

Figure 15:
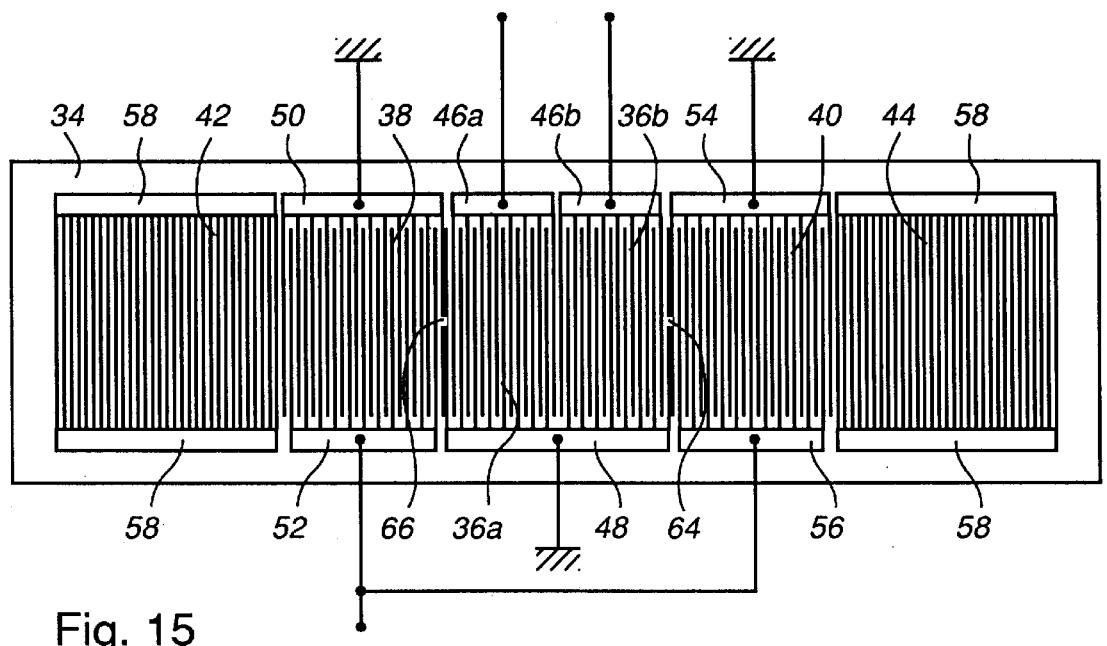
FIG. 15 schematically illustrates, and FIG. 16 schematically illustrates in greater detail features of, an LCR in accordance with a further embodiment of the invention.
Figure 16:
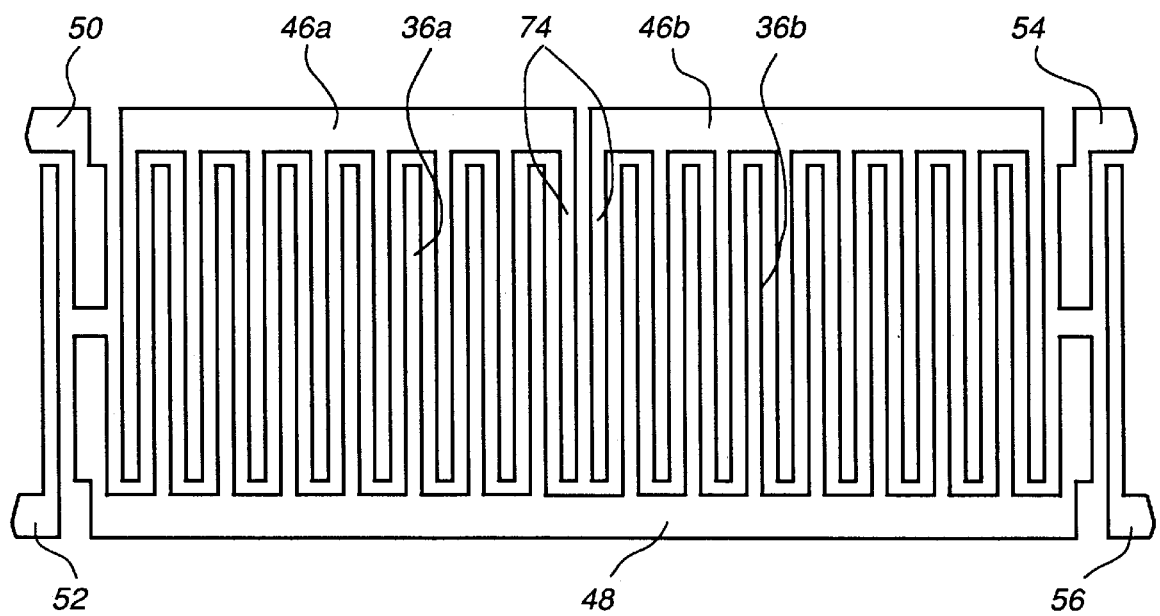

The embodiments of the invention described above provide a differential or balanced connection to the lateral IDTs 38 and 40 of the LCR. Alternatively (or in addition as described later below), a differential or balanced connection can be provided to the centre IDT 36. FIG. 15 illustrates an LCR in which the lateral IDTs 38 and 40 provide a single ended or unbalanced connection as in the prior all, and the centre IDT 36 provides a differential or balanced connection for the LCR. FIG. 16 illustrates the centre IDT of this LCR in greater detail. Except for the centre IDT and the connections to the IDTs, the LCR of FIGS. 15 and 16 is the same as the LCR described above with reference to FIGS. 5 and 6. Accordingly, only the differences are described here.

Referring to FIGS. 15 and 16, as in the prior art LCR of FIG. 2 the rail 48 of the centre IDT is grounded, the rails 50 and 54 of the lateral IDTs 38 and 40 are grounded, and a single ended or unbalanced connection is made in parallel to the rails 52 and 56 of the lateral IDTs 38 and 40. The signal (ungrounded) rail of the centre IDT is divided into two halves 46a and 46b which, instead of an unbalanced connection to the centre IDT 36 as in the LCR of FIG. 2 or FIG. 5, provide a balanced or differential connection to the centre IDT. The centre IDT correspondingly has two halves 36a and 36b, with signal fingers in the half 36a being connected to the rail half 48a and signal fingers in the half 36b being connected to the rail half 48b. Furthermore, there is a phase difference of 180° between the two halves 36a and 36b of the centre IDT. This is best illustrated in FIG. 16, in which it can be seen that two adjacent fingers 74 at the middle of the centre IDT are both signal fingers, one extending from the rail half 48a and the other extending from the rail half 48b. The finger pitch of $\lambda/2$ is maintained throughout the centre IDT halves 36a and 36b.

Thus, in the embodiment of the invention illustrated in FIGS. 15 and 16, the centre IDT halves 36a and 36b provide a differential or balanced arrangement, with a phase difference of 180° between the two halves and hence between the rail halves 46a and 46b, instead of the lateral IDTs 38 and 40 as in the previous embodiments of the invention. As illustrated, the gaps 64 and 66 are provided in the adjacent, touching fingers, although they need not be present with the particular connections illustrated because the rails 48, 50, and 54 are all grounded.

It can be appreciated that the division of the centre IDT 36 into two halves in this manner to provide a differential or balanced connection can also be applied to the other forms of the LCR which have already been described, using different connections, phases, and/or spacings of the lateral IDTs 38 and 40 to provide a single ended or unbalanced output so that the LCR still operates as a balun.

In addition, it may be desirable to provide an LCR which provides both a balanced input and a balanced output, for example for coupling between a balanced termination of an amplifier and a double balanced mixer. To this end, the division of the centre IDT 36 into two halves in the manner described above with reference to FIGS. 15 and 16 can be combined with the differential or balanced connection provided by the lateral IDTs 38 and 40 in any of the first to fifth embodiments of the invention. For example, the connections to the lateral IDTs 38 and 40 as shown in FIG. 5 may be made to the lateral IDTs of the LCR of FIGS. 15 and 16 to provide differential or balanced terminations at both the input and the output of the LCR. The second to fifth embodiments of the invention can similarly be modified to include a differential or balanced centre IDT as described below with reference to FIGS. 17 to 20 respectively.

Figure 17:
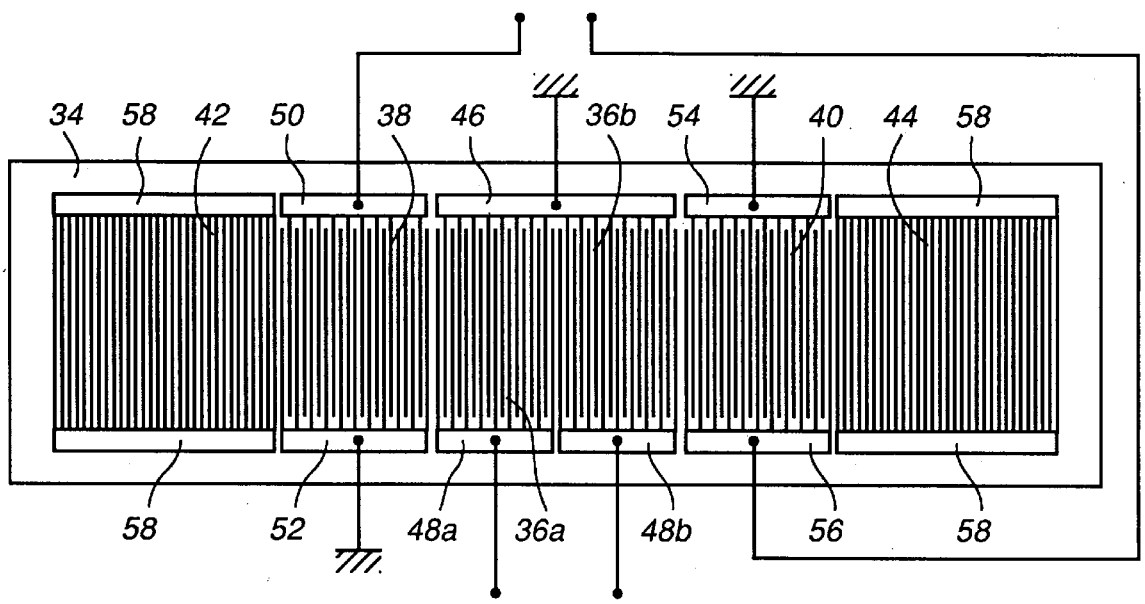
FIGS. 17 to 20 schematically illustrate further LCRs in accordance with the invention each providing a balanced input and a balanced output.
Figure 18:
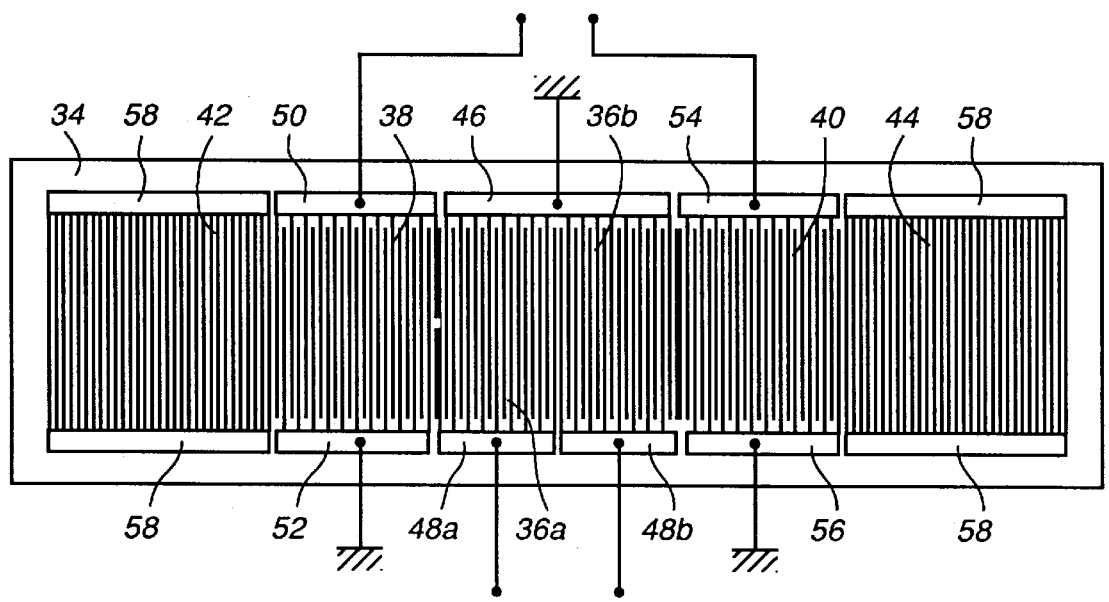

Thus FIG. 17 illustrates an LCR and its connections as shown in FIGS. 7 and 8, and FIG. 18 illustrates an LCR and its connections as shown in FIGS. 9 and 10, except that in each case the centre IDT 36 is divided into two oppositely phased halves 36a and 36b in which the signal (non-grounded) fingers extend from respective rail halves 48a and 48b into which the rail 48 is divided to provide a differential or balanced termination. The grounded fingers of the IDT halves 36a and 36b all extend from the grounded rail 46.

Figure 19:
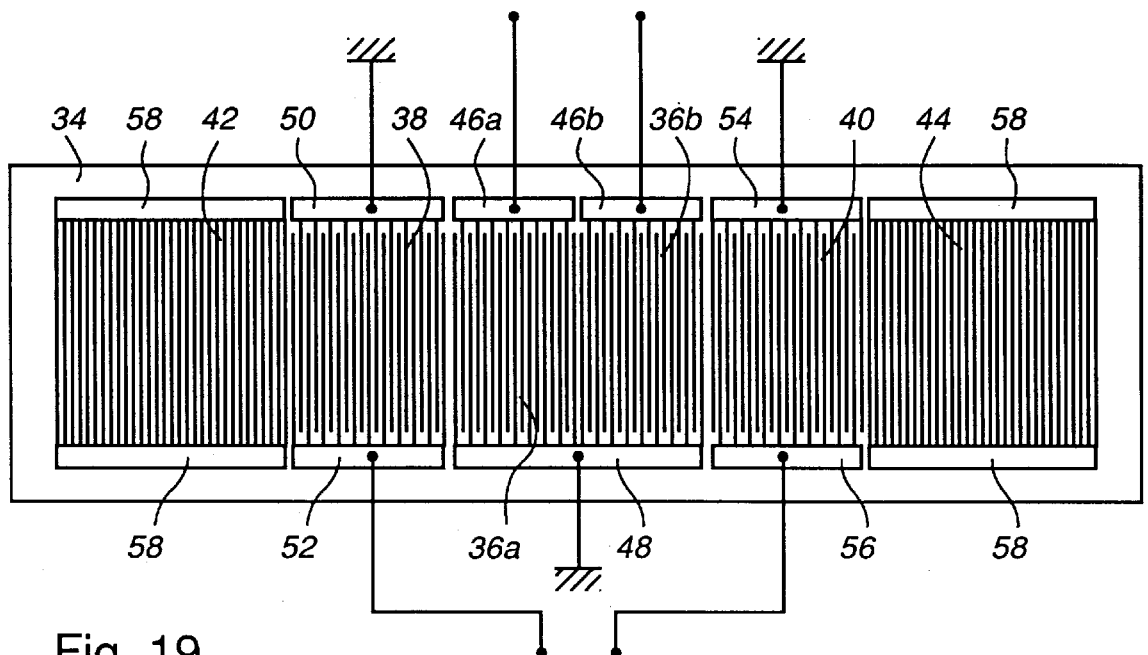
Figure 20:
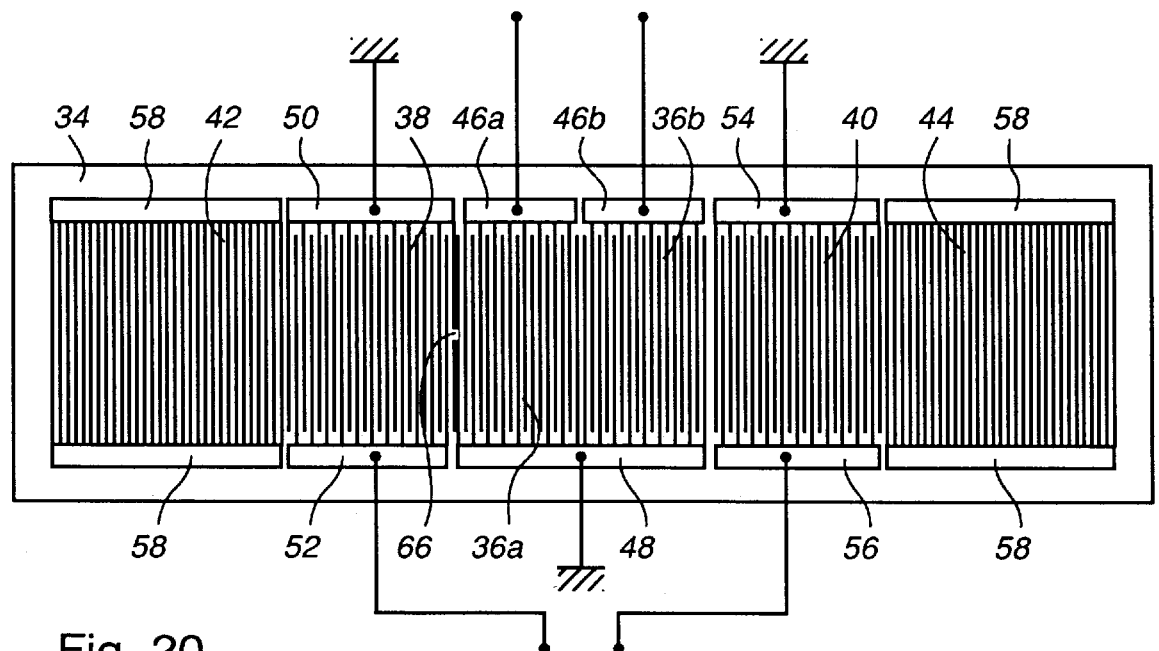

Similarly, FIG. 19 illustrates an LCR and its connections as shown in FIGS. 11 and 12, and FIG. 20 illustrates an LCR and its connections as shown in FIGS. 13 and 14, except that in each case the centre IDT 36 is divided into two oppositely phased halves 36a and 36b in which the signal (non-grounded) fingers extend from respective rail halves 46a and 46b into which the rail 46 is divided to provide a differential or balanced termination. The grounded fingers of the IDT halves 36a and 36b all extend from the grounded rail 48.

Thus the invention enables an LCR to be provided either with one unbalanced and one balanced termination, or two balanced terminations. It can also be appreciated that, for example, the LCR of FIGS. 5 and 6 or of FIGS. 7 and 8 can be provided with the conventional connections, shown in FIG. 2, to its lateral IDTs 38 and 40 to provide two unbalanced terminations for use in cascading LCRs as described below.

The LCRs described above each constitute a 2-pole filter. In order to provide particular filter characteristics, especially for image reject filters in transmitter and receiver circuits for cellular radio equipment, higher orders of filter, for example a 4-pole or 6-pole filter, may be needed. Two or more LCRs as described above can be connected in cascade to constitute a 4-pole, 6-pole, etc. filter. The particular choice of LCRs from the embodiments described above, and the cascade connections between the LCRs, can be made according to the number of LCRs and the desire for balanced and/or unbalanced terminations.

Although particular embodiments of the invention have been described in detail, it should be appreciated that numerous modifications, variations, and adaptations may be made without departing from the scope of the invention as defined in the claims. For example, the invention is equally applicable to asymmetrical arrangements of the IDTs, to arrangements in which one or more of the IDTs may be apodized, to surface wave resonators generally regardless of whether they use surface acoustic waves, leaky SAWs, or surface skimming bulk waves, and to different forms of reflection gratings as discussed above. It is also observed that the oppositely phased halves of the centre IDT, provided by a reversal of the polarity of the electrodes of one half of the centre IDT as described above, could instead be provided by a reversal of the connections to one half of the centre IDT; in this case both rails of the centre IDT would be divided into two halves.

What is claimed is:

1. A longitudinally coupled double mode surface wave resonator comprising:

a piezoelectric substrate;

two reflectors, two lateral IDTs (inter-digital transducers), and a centre IDT arranged on a surface of the substrate, with the IDTs between the two reflectors and with the centre IDT between the two lateral IDTs so that surface waves are coupled between the IDTs, each IDT having interleaved fingers extending from rails for providing connections to the IDT; and a differential signal connection to the two lateral IDTs, the differential signal connection comprising a respective connection to one rail of each lateral IDT, the arrangement being such that the two lateral IDTs operate with opposite signal phases.

2. A surface wave resonator as claimed in claim 1 wherein the centre IDT and at least one of its rails is divided into two halves arranged to operate with opposite signal phases with a balanced signal connection thereto.

3. A surface wave resonator as claimed in claim 1 wherein said one rail of one of the two lateral IDTs is on an opposite side of the IDTs from said one rail of the other of the two lateral IDTs.

4. A surface wave resonator as claimed in claim 3 wherein a finger-to-finger spacing of the centre IDT from each of the two lateral IDTs is about $\lambda/4+n\lambda/2$, where $\lambda$ is the wavelength of a SAW to be propagated and n is a positive integer.

5. A surface wave resonator as claimed in claim 4 wherein the lateral IDTs are arranged substantially symmetrically about the centre IDT.

6. A surface wave resonator as claimed in claim 3 wherein a finger-to-finger spacing of the centre IDT from at least one of the two lateral IDTs is about $\lambda/4$, where $\lambda$ is the wavelength of a SAW to be propagated, the fingers of the IDTs have a width of $\lambda/4$, and a gap is provided in adjacent fingers of the centre IDT and said at least one of the two lateral IDTs.

7. A surface wave resonator as claimed in claim 6 wherein the gap is provided substantially centrally in said adjacent fingers.

8. A surface wave resonator as claimed in claim 6 wherein the lateral IDTs are arranged substantially symmetrically about the centre IDT.

9. A surface wave resonator as claimed in claim 3 wherein the centre IDT and at least one of its rails is divided into two halves arranged to operate with opposite signal phases with a balanced signal connection thereto.

10. A surface wave resonator as claimed in claim 1 wherein the fingers of the two lateral IDTs are arranged with a relative phase difference of 180° and said one rails of the lateral IDTs are bot on one side of the IDTs.

11. A surface wave resonator as claimed in claim 10 wherein a finger-to-finger spacing of the centre IDT from each of the two lateral IDTs is about $\lambda/4+n\lambda/2$, where $\lambda$ is the wavelength of a SAW to be propagated and n is a positive integer.

12. A surface wave resonator as claimed in claim 11 wherein the lateral IDTs have substantially the same spacing each from the centre IDT.

13. A surface wave resonator as claimed in claim 10 wherein a finger-to-finger spacing of the centre IDT from at least one of the two lateral IDTs is about $\lambda/4$, where $\lambda$ is the wavelength of a SAW to be propagated, the fingers of the IDTs have a width of $\lambda/4$, and a gap is provided in adjacent fingers of the centre IDT and said at least one of the two lateral IDTs.

14. A surface wave resonator as claimed in claim 13 wherein the gap is provided substantially centrally in said adacent fingers.

15. A surface wave resonator as claimed in claim 13 wherein a finger-to-finger spacing of the centre IDT from the other of the two lateral IDTs is also about $\lambda/4$, and a gap is provided in adjacent fingers of the centre IDT and this other lateral IDT.

16. A surface wave resonator as claimed in claim 10 wherein the centre IDT and at least one of its rails is divided into two halves arranged to operate with opposite signal phases with a balanced signal connection thereto.

17. A surface wave resonator as claimed in claim 1 wherein finger-to-finger spacings of the centre IDT from the two lateral IDTs differ for the two lateral IDTs by substantially $\lambda/2+m\lambda$, where $\lambda$ is the wavelength of a SAW to be propagated and m is zero or a positive integer.

18. A surface wave resonator as claimed in claim 17 wherein a finger-to-finger spacing of the centre IDT from each of the two lateral IDTs is about $\lambda/4+n\lambda/2$, where n is zero or a positive integer.

19. A surface wave resonator as claimed in claim 17 wherein a finger-to-finger spacing of the centre IDT from one of the two lateral IDTs is about $\lambda/4$.

20. A surface wave resonator as claimed in claim 19 wherein the fingers of the IDTs have a width of $\lambda/4$ and a gap is provided in adjacent fingers of the centre IDT and said one of the two lateral IDTs.

21. A surface wave resonator as claimed in claim 20 wherein a finger-to-finger spacing of the centre IDT from the other of the two lateral IDTs is about $3\lambda/4$.

22. A surface wave resonator as claimed in claim 19 wherein a finger-to-finger spacing of the centre IDT from the other of the two lateral IDTs is about $3\lambda/4$.

23. A surface wave resonator as claimed in claim 17 wherein the centre IDT and at least one of its rails is divided into two halves arranged to operate with opposite signal phases with a balanced signal connection thereto.

24. A radio frequency circuit including a mixer and a surface wave resonator as claimed in claim 1, wherein the mixer has a balanced termination connected directly to said differential signal connection.

25. A surface wave resonator comprising:

a piezoelectric substrate;

two reflectors, two lateral IDTs (inter-digital transducers), and a centre IDT arranged on a surface of the substrate, with the IDTs between the two reflectors and with the centre IDT between the two lateral IDTs for coupling surface waves between the IDTs, the two lateral IDTs being substantially symmetrical about the centre IDT, each IDT having interleaved fingers extending from two rails for providing connections to the IDT;

a single ended connection to a first rail of the centre IDT;

a differential signal connection to the two lateral IDTs, the differential signal connection comprising a connection to a first rail of one lateral IDT on one side of the IDTs and a connection to a first rail of the other lateral IDT on the opposite side of the IDTs; and a ground connection to a second rail of each of the IDTs.

26. A surface wave resonator as claimed in claim 25 wherein a finger-to-finger spacing of the centre IDT from each of the two lateral IDTs is about $\lambda/4+n\lambda/2$, where $\lambda$ is the wavelength of a SAW to be propagated and n is a positive integer.

27. A surface wave resonator as claimed in claim 25 wherein a finger-to-finger spacing of the centre IDT from each of the two lateral IDTs is about $\lambda/4$, where $\lambda$ is the wavelength of a SAW to be propagated, the fingers of the IDTs have a width of $\lambda/4$, and a gap is provided in adjacent fingers of the centre IDT and each lateral IDT.

28. A radio frequency circuit including a mixer and a surface wave resonator as claimed in claim 25, wherein the mixer has a balanced termination connected directly to said differential signal connection.

29. A surface wave resonator comprising:

a piezoelectric substrate;

two reflectors, two lateral IDTs (inter-digital transducers), and a centre IDT arranged on a surface of the substrate, with the IDTs between the two reflectors and with the centre IDT between the two lateral IDTs for coupling surface waves between the IDTs, each IDT having interleaved fingers extending from two rails for providing connections to the IDT, the two lateral IDTs having their fingers oppositely phased to provide opposite polarities and otherwise being substantially symmetrical about the centre IDT;

a single ended connection to a first rail of the centre IDT;

a differential signal connection to the two lateral IDTs, the differential signal connection comprising connections to a first rail of each lateral IDT, the first rails of the lateral IDTs being both on one side of the IDTs; and a ground connection to a second rail of each of the IDTs.

30. A surface wave resonator as claimed in claim 29 wherein a finger-to-finger spacing of the centre IDT from each of the two lateral IDTs is about $\lambda/4+n\lambda/2$, where $\lambda$ is the wavelength of a SAW to be propagated and n is a positive integer.

31. A surface wave resonator as claimed in claim 29 wherein a finger-to-finger spacing of the centre IDT from each of the two lateral IDTs is about $\lambda/4$, where $\lambda$ is the wavelength of a SAW to be propagated, the fingers of the IDTs have a width of $\lambda/4$, and a gap is provided in adjacent fingers of the centre IDT and each lateral IDT.

32. A radio frequency circuit including a mixer and a surface wave resonator as claimed in claim 29, wherein the mixer has a balanced termination connected directly to said differential signal connection.

33. A surface wave resonator comprising:

a piezoelectric substrate;

two reflectors, two lateral IDTs (inter-digital transducers), and a centre IDT arranged on a surface of the substrate, with the IDTs between the two reflectors and with the centre IDT between the two lateral IDTs for coupling surface waves between the IDTs, each IDT having interleaved fingers extending from two rails for providing connections to the IDT, the two lateral IDTs having finger-to-finger spacings from the centre IDT which differ by substantially $\lambda/2+m\lambda$, where $\lambda$ is the wavelength of a SAW to be propagated and m is zero or a positive integer, the two lateral IDTs otherwise being substantially symmetrical about the centre IDT;

a single ended connection to a first rail of the centre IDT;

a differential signal connection to the two lateral IDTs, the differential signal connection comprising connections to a first rail of each lateral IDT, the first rails of the lateral IDTs being both on one side of the IDTs; and a ground connection to a second rail of each of the IDTs.

34. A surface wave resonator as claimed in claim 33 wherein said spacings are about $\lambda/4$ and $3\lambda/4$.

35. A radio frequency circuit including a mixer and a surface wave resonator as claimed in claim 33, wherein the mixer has a balanced termination connected directly to said differential signal connection.

36. A longitudinally coupled double mode surface wave resonator comprising:

a piezoelectric substrate; and two reflectors, two lateral IDTs (inter-digital transducers), and a centre IDT arranged on a surface of the substrate, with the IDTs between the two reflectors and with the centre IDT between the two lateral IDTs so that surface waves are coupled between the IDTs, each IDT having interleaved fingers extending from rails for providing connections to the IDT;

wherein the centre IDT and at least one of its rails is divided into two halves arranged to operate with opposite signal phases with a balanced signal connection thereto.

37. A surface wave resonator as claimed in claim 36 wherein the two halves of the centre IDT have fingers arranged with a relative phase difference of 180°.

38. A surface wave resonator as claimed in claim 36 wherein a finger-to-finger spacing of the centre IDT from each of the two lateral IDTs is about $\lambda/4+n\lambda/2$, where $\lambda$ is the wavelength of a SAW to be propagated and n is a positive integer.

39. A surface wave resonator as claimed in claim 36 wherein a finger-to-finger spacing of the centre IDT from at least one of the two lateral IDTs is about $\lambda/4$, where $\lambda$ is the wavelength of a SAW to be propagated, the fingers of the IDTs have a width of $\lambda/4$ and a gap is provided in adjacent fingers of the centre IDT and said at least one of the two lateral IDTs.

40. A surface wave resonator as claimed in claim 39 wherein the gap is provided substantially centrally in said adjacent fingers.

41. A radio fiequency circuit including a mixer and a surface wave resonator as claimed in claim 36, wherein the mixer has a balanced termination connected directly to said balanced signal connection to the centre IDT of the surface wave resonator.

* * * * *